(12) United States Patent
Hwang et al.

(10) Patent No.: US 7,800,197 B2
(45) Date of Patent: Sep. 21, 2010

(54) SEMICONDUCTOR DEVICE AND METHOD OF FABRICATING THE SAME

(75) Inventors: Yun Taek Hwang, Icheon-si (KR); Kwang Yong Lim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 113 days.

(21) Appl. No.: 12/134,144

(22) Filed: Jun. 5, 2008

(65) Prior Publication Data
US 2009/0146246 A1 Jun. 11, 2009

(30) Foreign Application Priority Data
Dec. 11, 2007 (KR) .................. 10-2007-0128346

(51) Int. Cl.
H01L 27/00 (2006.01)
H01L 21/20 (2006.01)
H01L 21/336 (2006.01)

(52) U.S. Cl. ............... 257/508; 257/306; 257/E27.001; 257/E21.133; 257/E21.4; 438/280; 438/492

(58) Field of Classification Search ................. 257/202, 257/204, 508, 368, 371, 296, 390, 306, 206, 257/221, E27.001, E21.133, E21.4, E27.086, 257/E27.099, 903, 904; 438/280, 492; 365/158, 365/171, 173, 154, 207, 156, 208

See application file for complete search history.

(56) References Cited

U.S. PATENT DOCUMENTS 6,677,633 B2 *  1/2004  Sakata et al. ............... 257/296
2009/0108318 A1 * 4/2009  Yoon et al. .................. 257/306

FOREIGN PATENT DOCUMENTS

| JP | 2004-281971 | 10/2004 |
| KR | 1020020010813 A | 2/2002 |
| KR | 1020060076162 | 7/2006 |
| KR | 1020070021512 A | 2/2007 |

* cited by examiner

Primary Examiner—Victor A Mandala
Assistant Examiner—Whitney Moore
(74) Attorney, Agent, or Firm—Townsend and Townsend and Crew LLP

(57) ABSTRACT

The present invention relates to a semiconductor device and a method of manufacture thereof, being capable of improving the high integration by increasing a cell region while securing the reliability of device and the process margin through forming a cell region and a core region with the stacking structure.

18 Claims, 6 Drawing Sheets

SEMICONDUCTOR DEVICE AND METHOD OF FABRICATING THE SAME

CROSS-REFERENCES TO RELATED APPLICATIONS

The priority of Korean patent application number 10-2007-0128346, filed on Dec. 11, 2007, which is incorporated by reference in its entirety, is claimed.

BACKGROUND OF THE INVENTION

The present invention relates to a semiconductor device, and more specifically to a method of increasing the level of integration while maintaining the reliability of a device by using a stacked structure.

A semiconductor device comprises of a plurality of circuits. Generally, a memory semiconductor device like DRAM is comprised of a cell region, a core region, and a peripheral region. The cell region stores data. The core region has a circuit for accessing data stored in the cell region. The peripheral region has a circuit for driving the memory semiconductor device and the data input/output.

In the cell region, memory cells including a cell transistor and a cell capacitor are arranged in an array type. Such a cell region includes a plurality of unit cell arrays.

In the core region, the circuit including a sub-word line driver and a sense amplifier is formed. At this time, the sub-word line driver drives the sub-word line according to the voltage level of the main word line. The sense amplifier senses and amplifies the data of a cell.

A bank includes a plurality of unit cell arrays and a plurality of core regions. For example, in the case of the DDR2 512 Mbit device, it has four banks. The peripheral region in which the circuit including a free decoder, an input buffer, and an output buffer is formed is provided between these banks.

Recently, more circuits, particularly, more memory cells have to be formed in a limited chip area, since high integration is required as the size of the semiconductor device has been reduced.

However, a trade-off relation exists between the net die increment and the reliability assurance of a device. Thus, the reliability of a device is decreased if the net die is increased. That is, in the current DRAM structure, there is a structural limit in increasing the net die while not reducing the reliability of a device.

BRIEF SUMMARY OF THE INVENTION

Embodiments of the present invention relate to maintaining the reliability of a semiconductor device and improve the integration through increasing a cell region by forming the cell region and a core region with a stacked structure.

According to an embodiment of the present invention, a semiconductor device includes a cell array region formed on a first semiconductor substrate; and a core circuit unit formed on a second semiconductor substrate over the cell array.

The core circuit unit comprises at least one of a sense amplifier and a sub-word line driver. The sense amplifier is electrically connected to a bit line of the cell array. The sub-word line driver is electrically connected to a word line of the cell array. The second semiconductor substrate is an epitaxial growth layer with the first semiconductor substrate as a seed layer. The semiconductor device according to an embodiment of the present invention further comprises a contact region for forming the second semiconductor substrate by growing the first semiconductor substrate. The semiconductor device according to an embodiment of the present invention further comprises an insulating layer formed between the cell array region and the second semiconductor substrate. The insulating layer has a thickness range from 500 Å to 5,000 Å. The insulating layer is formed with one of an oxide film, a nitride film and the combinations thereof.

According to an embodiment of the present invention, a method of fabricating a semiconductor device includes forming a cell array on a first semiconductor substrate; forming a second semiconductor substrate over the cell array; and forming a core circuit on the second semiconductor substrate.

The forming a second semiconductor substrate comprises forming a contact hole which exposes the first semiconductor substrate by selectively etching a interlayer dielectric layer included in the cell array; and growing the first semiconductor substrate through the contact hole. The method of fabricating a semiconductor device according to an embodiment of the present invention further comprises planarly etching the grown up semiconductor substrate. The growing the first semiconductor substrate performs an epitaxial growth method with the first semiconductor substrate exposed through the contact hole as a seed layer. The method of fabricating a semiconductor device according to an embodiment of the present invention further comprises forming an insulating layer between the cell array and the second semiconductor substrate. The insulating layer has a thickness range from 500 Å to 5,000 Å. The insulating layer is formed with one of an oxide film, a nitride film and the combinations thereof. The forming a core circuit comprises forming a device isolation structure defining an active region in the second semiconductor substrate; and forming a transistor on the active region. The method of fabricating a semiconductor device according to an embodiment of the present invention further comprises electrically connecting a sense amplifier of the core circuit and a bit line of the cell array. The method of fabricating a semiconductor device according to an embodiment of the present invention further comprises electrically connecting a sub-word line driver of the core circuit and a word line of the cell array.

DESCRIPTION OF EMBODIMENTS

Figure 1:
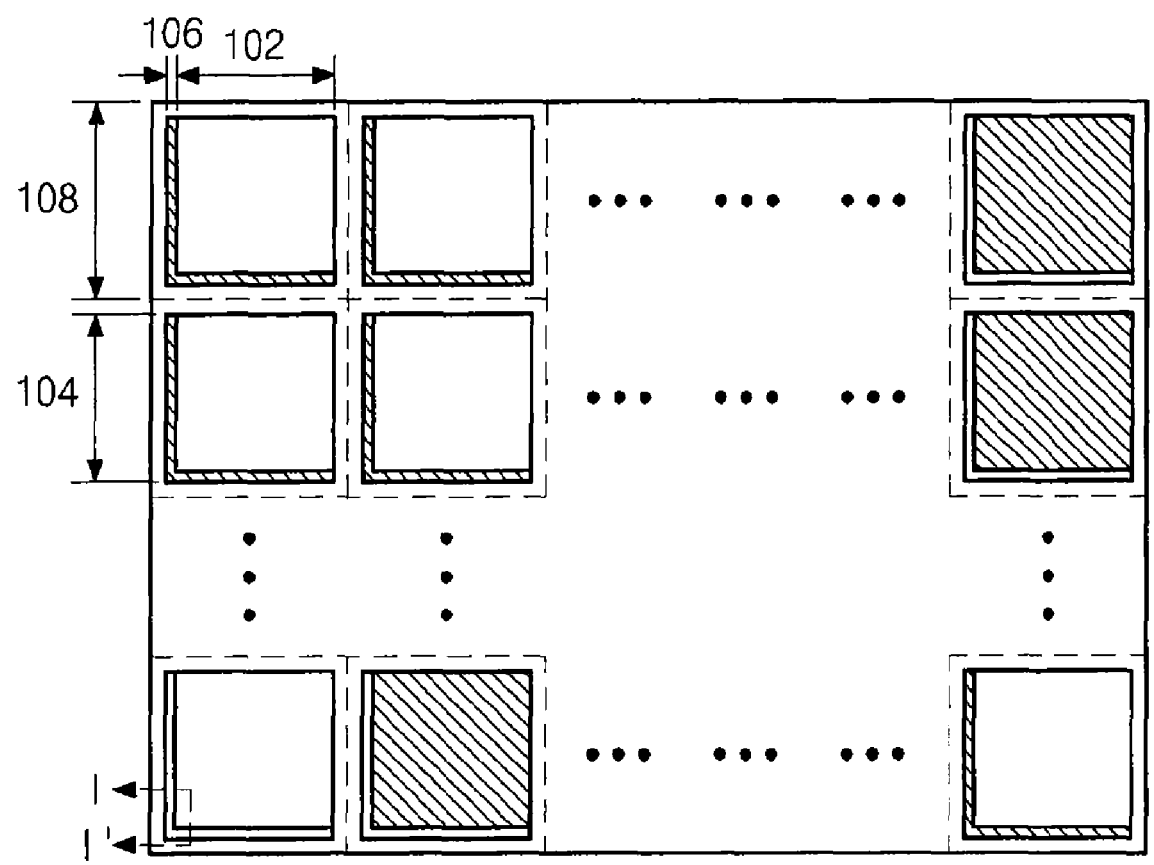
FIG. 1 is a layout of a semiconductor device according to an embodiment of the present invention.

FIG. 1 is a layout of a semiconductor device according to an embodiment of the present invention, showing banks of the semiconductor device.

The semiconductor device includes a first semiconductor substrate region 102, a second semiconductor substrate region 104 and a cell/core region 108.

The unit cell array including word lines (not shown), bit lines (not shown), and memory cells are formed on the first semiconductor substrate region 102. Each memory cell includes a cell transistor and a cell capacitor.

The second semiconductor substrate region 104 is used as a core circuit region where circuits such as sense amplifier and a sub-word line driver are formed. The second semiconductor substrate region 104 includes a contact region 106, and formed over the first semiconductor substrate region 102. That is, in the present embodiment, the first semiconductor substrate region 102 and the second semiconductor substrate region 104 are formed in a stacked structure.

Since the first semiconductor substrate region 102 and the second semiconductor substrate region 104 are formed on different layers, the size of the first semiconductor substrate region 102 can be increased. Therefore, the cell efficiency and the process margin can be improved as the cell array region is increased. In one embodiment, the contact region 106 is formed at outer side of the first semiconductor substrate region 102, but may be formed at other locations.

The cell/core region 108 is a region including the first semiconductor substrate region 102 and the second semiconductor substrate region 104.

Figure 2:
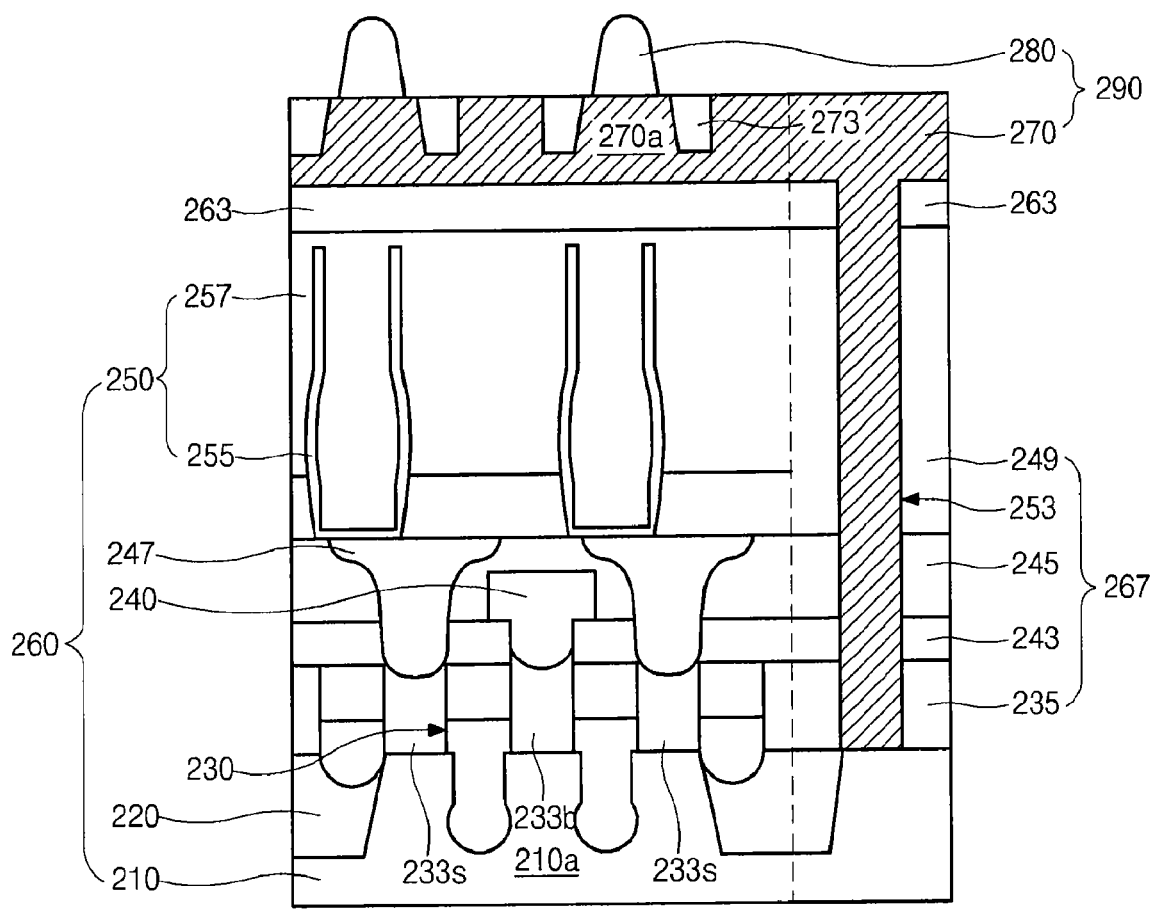
FIG. 2 is a cross-sectional view taken along I-I' of the semiconductor device of FIG. 1.

FIG. 2 is a cross-sectional view taken along I-I' of the semiconductor device of FIG. 1.

The semiconductor device includes a cell array unit 260 and a core circuit unit 290. At this time, the cell array unit 260 and the core circuit unit 290 are formed in a stacked structure. For example, the core circuit unit 290 is formed over the cell array unit 260.

The cell array unit 260 includes memory cells having a gate 230 and a capacitor 250. The memory cells are arranged in an array. In the present embodiment, for the sake of convenience, only two memory cells are shown.

The cell array unit 260 includes the gate 230, a bit line 240 and the capacitor 250. The gate 230 is formed in a first active region 210a of a first semiconductor substrate (or first semiconductor material) 210 defined by a first device isolation structure 220. And the bit line 240 is formed in a second interlayer dielectric layer 243 while being electrically connected to a landing plug 233b formed between the gates 230. The capacitor 250 is formed on a storage electrode contact plug 247 and a third interlayer dielectric layer 245. The storage electrode contact plug 247 is electrically connected to a landing plug 233s, and is formed within the second interlayer dielectric layer 243 and the third interlayer dielectric layer 245. In addition, the third interlayer dielectric layer 245 is formed on the bit line 240 and the second interlayer dielectric layer 243.

The core circuit unit 290 includes a second semiconductor substrate (or second semiconductor material) 270, a second device isolation structure 273, and a transistor 280. The second semiconductor substrate 270 is formed over the cell array unit 260. At this time, the second semiconductor substrate 270 may be formed with an epitaxial growth layer which uses the first semiconductor substrate 210 as a seed layer. For example, a first to a fourth interlayer dielectric layer 235, 243, 245, 249 are selectively etched until the first semiconductor substrate 210 is exposed so that the contact hole 253 is formed. Then, the epitaxial growth is carried out with the first semiconductor substrate 210 exposed in the lower portion of the contact hole 253 as a seed layer so that the second semiconductor substrate 270 can be formed. In other embodiments, the second semiconductor substrate (or layer) may be formed using different methods according to application.

The transistor 280 is formed on a second active region 270a defined with the second device isolation structure 273. The transistor 280 may be an element used to form the core circuit such as a sense amplifier or a sub-word line driver. The transistor 280 may be electrically connected to the word line (not shown) or the bit line 240 of the cell array unit 260. An insulating layer 263 is formed between the second semiconductor substrate 270 and the capacitor 250 in order to isolate the cell array unit 260 and the core circuit unit 290. The insulating layer 263 may be formed with one of the oxide film, the nitride film and combinations thereof.

FIGS. 3a to 3d are cross-sectional views showing the manufacturing method of the semiconductor device of FIG. 2.

A first device isolation structure 320 is formed on a first semiconductor substrate 310 including a cell array region 3000c and a contact region 3000p to define a first active region 310a. A gate 330 is formed on the first active region 310a. In the present embodiment, the gate 330 has the recess structure, but it is not limitative.

A first interlayer dielectric layer 335 is formed on the first device isolation structure 320, the first active region 310a, and the gate 330. Then, a landing plug contact hole (not shown) exposing the first active region 310a is formed between the gates 330 by eliminating a part of a first interlayer dielectric layer 335. And a first conductive layer (not shown) is formed so that the landing plug contact hole can be filled. Landing plugs 333s, 333b are isolated by using a planarizing etch for the first conductive layer until the upper portion of the gate 330 is exposed.

A second interlayer dielectric layer 343 is formed on the landing plugs 333s, 333b, the gate 330, and the first interlayer dielectric layer 335. Then, a part of a second interlayer dielectric layer 343 is selectively etched in order to expose the landing plug 333b so that a bit line contact hole (not shown) is formed. After a second conductive layer (not shown) is formed on the second interlayer dielectric layer 343 including the bit line contact hole, a bit line 340 is formed by patterning the second conductive layer with a bit line mask (not shown).

A third interlayer dielectric layer 345 is formed on the bit line 340 and the second interlayer dielectric layer 343. A storage electrode plug contact hole (not shown) which exposes the landing plug 333s is formed by selectively etching a part of the third interlayer dielectric layer 345 and the second interlayer dielectric layer 343. After a third conductive layer (not shown) is formed on the third interlayer dielectric layer 345 including the storage electrode plug contact hole, a storage electrode contact plug 347 is formed by planarly etching the third conductive layer.

Then, after a fourth interlayer dielectric layer 349 is formed on the storage electrode contact plug 347, the fourth interlayer dielectric layer 349 is selectively etched to form a storage electrode contact hole (not shown) exposing the storage electrode contact plug 347. After a fourth conductive layer (not shown) is formed on the fourth interlayer dielectric layer 349 including the storage electrode contact hole, a bottom plate 355 is formed by planarly etching the fourth conductive layer.

Then, after the dip-out process is performed to eliminate the fourth interlayer dielectric layer 349 of the cell array region 3000c, a dielectric layer (not shown) and an top plate 357 are formed on the first semiconductor substrate 310 including the bottom plate 355. At this time, the capacitor 350 includes the bottom plate 355, the dielectric layer, and the top plate 357. As a result, a cell array 360 is formed in the cell array region 3000c. As to the method for forming the cell array on the semiconductor substrate 310, other methods apart from the above-described method can be applied.

Thereafter, an insulating layer 363 is formed over the first semiconductor substrate 310 including the unit cell array region 3000c and the contact region 3000p. The insulating layer 363 electrically isolates the core circuit to be formed from the cell array 360. In addition, the insulating layer 363 may be formed to a thickness of 500 Å to 5,000 Å. The insulating layer 363 may be formed with one of an oxide film, a nitride film and combinations thereof. Other dielectric materials may be used in other implementations.

Figure 3A:
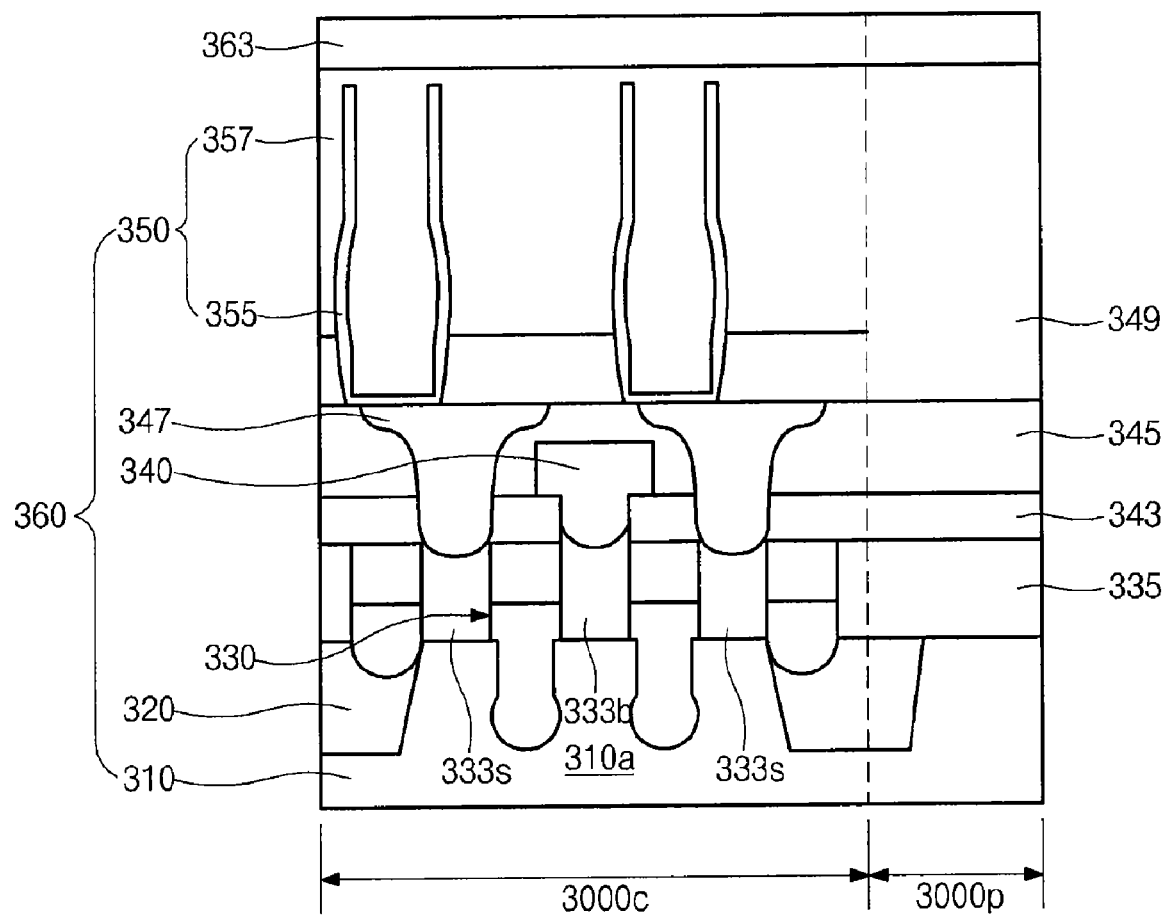
FIGS. 3a to 3d are cross-sectional views showing the manufacturing method of the semiconductor device of FIG. 2.
Figure 3B:
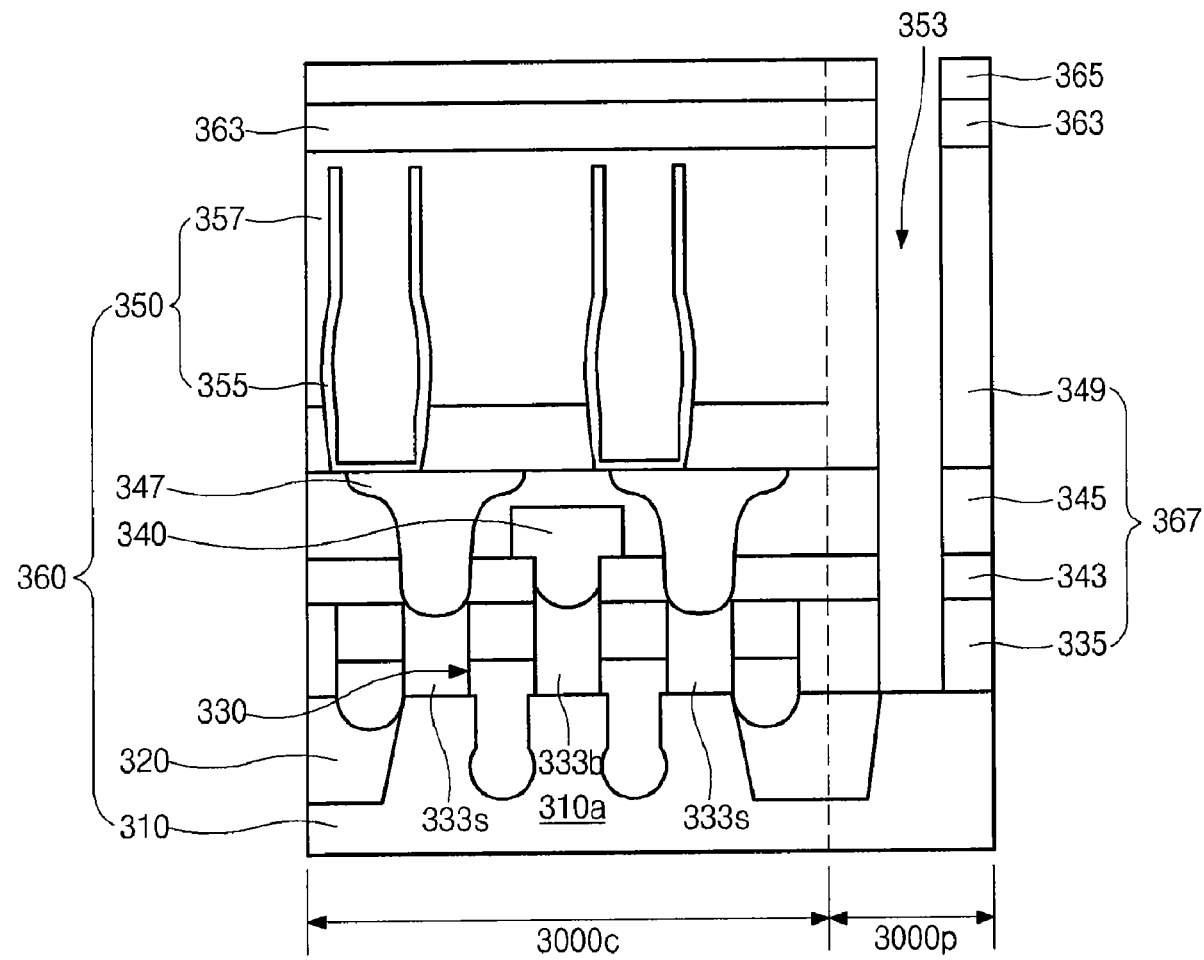

Referring to FIG. 3b, after a photosensitive layer (not shown) is formed on the insulating layer 363, the photosensitive pattern 365 is formed through an exposure and development process for the photosensitive layer by using the mask (not shown), exposing a part of the contact region 3000p. Then, a contact hole 353 which exposes the first semiconductor substrate 310 is formed by selectively etching the insulating layer 363 and an interlayer dielectric layer 367 using the photosensitive pattern 365 as a mask.

Figure 3C:
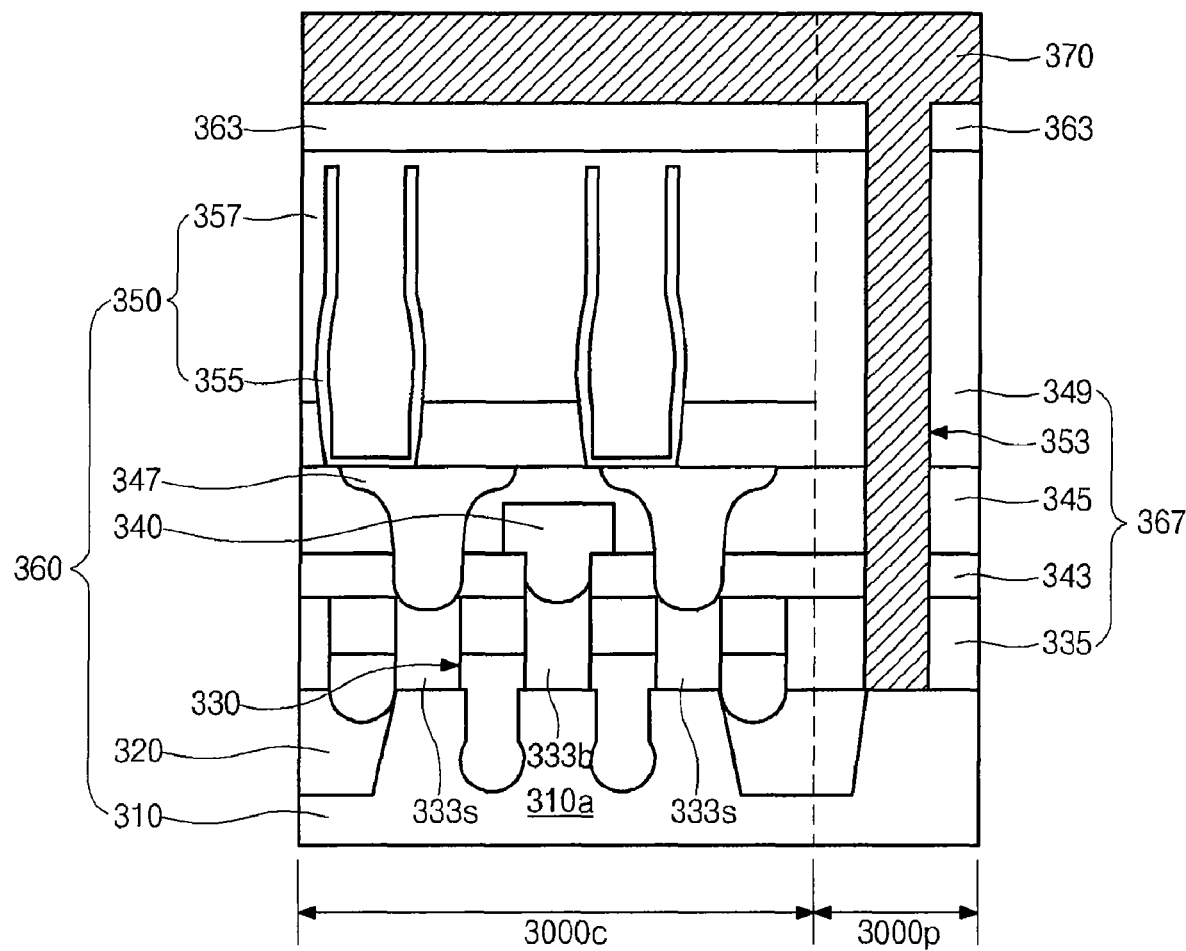

Referring to FIG. 3c, the photosensitive pattern 365 is removed. A second semiconductor substrate 370 is epitaxially grown on the insulating layer 363 using a portion of the first semiconductor substrate 310 exposed by the contact hole 353 as a seed layer. The second semiconductor substrate 370 fills the contact hole 353 due to the epitaxial growth method. In one embodiment, the epitaxial growth method is performed in a temperature range of 350° C. to 850° C. The epitaxial growth method fills the contact hole 353. And the growth time can be controlled so that the second semiconductor substrate 370 is formed over unit cell array region 3000c and the contact region 3000p.

Then, the second semiconductor substrate 370 is planarized. The planarization process can be performed using the chemical mechanical polishing (CMP), the etch-back method, or both. Although the second semiconductor substrate 370 is formed over both the cell array region 3000c and the contact region 3000p, the invention is not limited to such an embodiment. For example, the second semiconductor substrate 370 can be formed on a part of the cell array region 3000c or the contact region 3000p.

Figure 3D:
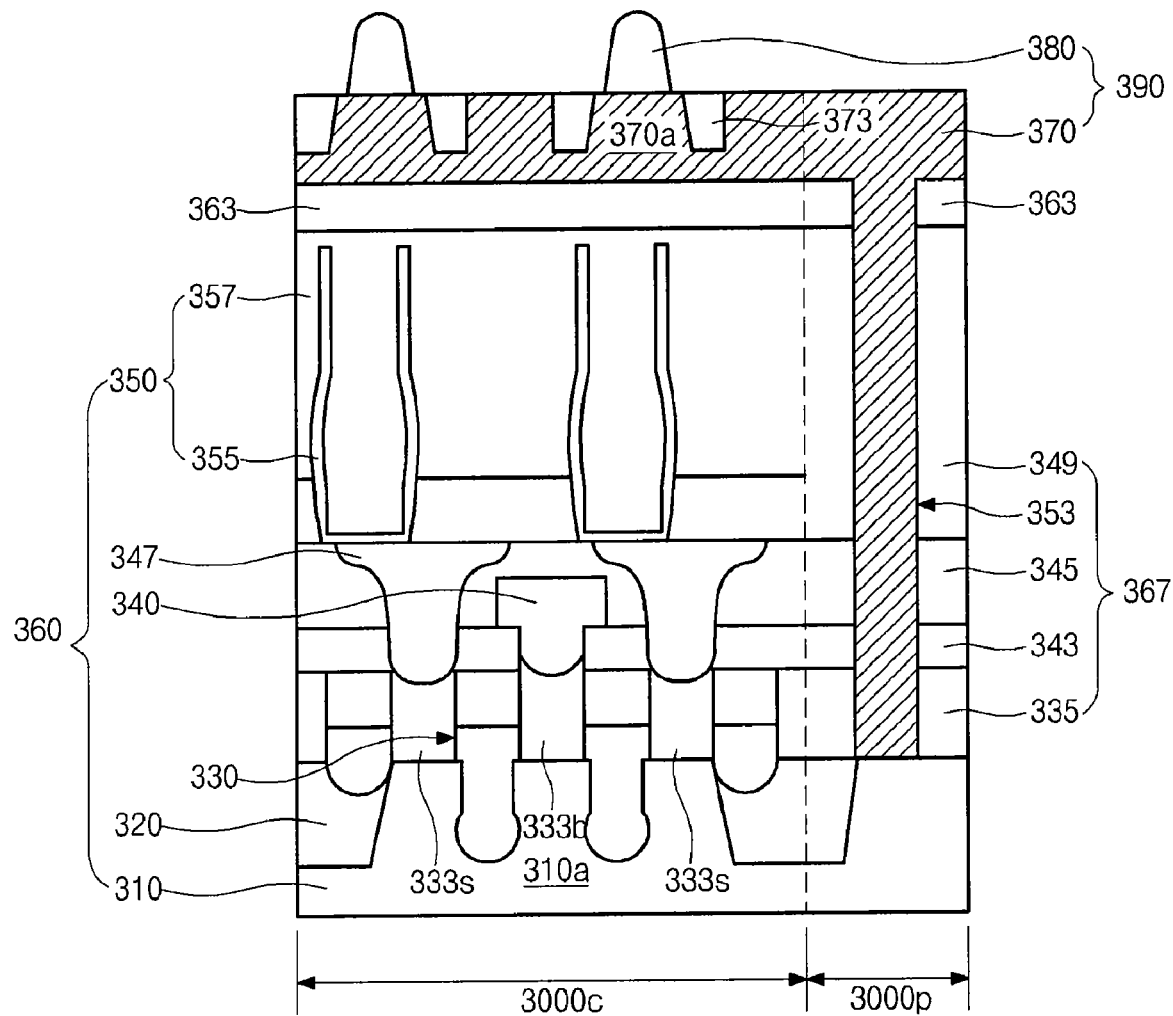

Referring to FIG. 3d, a second device isolation structure 373 defining a second active region 370a is formed in the second semiconductor substrate 370. A transistor 380 is formed on the second active region 370a. The second semiconductor substrate 370 and the transistor 380 form a core circuit 390 such as a sense amplifier and a sub-word line driver. In addition to the sense amplifier and the sub-word line driver, the core circuit 390 may have other types of circuits.

Thereafter, in the subsequent interconnection forming process, an interconnection (not shown) which electrically connect the word line (not shown) of the cell array 360, or the bit line 340 to the core circuit 390 is formed. For example, the interconnection is formed in order that the sense amplifier of the core circuit 390 is connected to the bit line 340, while the interconnection is formed in order for the sub-word line driver of the core circuit 390 to be connected to the word line. After that, the subsequent processes such as a fuse formation process is performed and the semiconductor device can be completed.

As described above, by forming the first semiconductor substrate in which the cell array is formed and the second semiconductor substrate in which the core circuit is formed with the stacked structure, the present invention can increase the cell array region while securing the reliability and the process margin of a device.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A semiconductor device, comprising:
 a cell array unit formed on a first semiconductor material;
 a core circuit unit formed on a second semiconductor material over the cell array; and
 a dielectric layer separating the cell array unit and the core circuit unit,
 wherein the second semiconductor material is grown using the first semiconductor material as a seed layer.

2. The semiconductor device of claim 1, wherein the core circuit unit comprises at least one of a sense amplifier and a sub-word line driver.

3. The semiconductor device of claim 2, wherein the sense amplifier is electrically connected to a bit line of the cell array.

4. The semiconductor device of claim 2, wherein the sub-word line driver is electrically connected to a word line of the cell array.

5. The semiconductor device of claim 1, wherein the second semiconductor material is epitaxially grown using the first semiconductor material as a seed layer.

6. The semiconductor device of claim 5, wherein the second semiconductor material has a vertical portion that extends downward to contact the first semiconductor material at the contact region.

7. The semiconductor device of claim 1, wherein the first and second semiconductor materials are of the same material.

8. The semiconductor device of claim 7, wherein the dielectric layer has a thickness of 500 Å to 5,000 Å.

9. The semiconductor device of claim 5, wherein the dielectric layer includes oxide, nitride, or both.

10. A method of fabricating a semiconductor device, the method comprising:
 forming a cell array on a first semiconductor material;
 forming a second semiconductor material over the cell array; and
 forming a core circuit on the second semiconductor material,
 wherein the first and second semiconductor materials are separated by at least one layer, and wherein forming the second semiconductor material comprises
 etching the at least one layer to form a contact hole that exposes the first semiconductor material, and
 growing semiconductor material within the contact hole using the first semiconductor material as a seed layer.

11. The method of claim 10, wherein the semiconductor material is grown until the second semiconductor material is defined by the growth of the semiconductor material, the method further comprising planarizing the second semiconductor material.

12. The method of claim 10, wherein the first and second semiconductor materials are for the same material.

13. The method of claim 10, further comprising forming an insulating layer between the cell array and the second semiconductor material to separate the cell array and the core circuit.

14. The method of claim 13, wherein the insulating layer has a thickness range of 500 Å to 5,100 Å.

15. The method of claim 13, wherein the insulating layer includes an oxide film, a nitride film, or both.

16. The method of claim 10, wherein forming a core circuit comprises:
 forming a device isolation structure defining an active region in the second semiconductor material; and
 forming a transistor on the active region.

17. The method of claim 10, further comprising electrically connecting a sense amplifier of the core circuit and a bit line of the cell array.

18. The method of claim 10, further comprising electrically connecting a sub-word line driver of the core circuit and a word line of the cell array.

* * * * *